United States Patent

Ohshita et al.

[11] Patent Number: 6,120,708
[45] Date of Patent: Sep. 19, 2000

[54] CONDUCTIVE PASTE AND METHOD FOR PRODUCING CERAMIC SUBSTRATE USING THE SAME

[75] Inventors: Kazuhito Ohshita, Omihachiman; Yoshiki Nakagawa, Shiga-ken, both of Japan

[73] Assignee: Murata Manufacturing Co., Ltd., Japan

[21] Appl. No.: 09/276,328

[22] Filed: Mar. 25, 1999

[30] Foreign Application Priority Data

Mar. 25, 1998 [JP] Japan ................... 10-077353

[51] Int. Cl.$^7$ ...................................... H01B 1/06
[52] U.S. Cl. ................ 252/511; 252/512; 252/518.1; 156/89.11; 156/89.18
[58] Field of Search ........................ 252/511, 512, 252/518.1, 503; 246/614; 156/89.18, 89.11

[56] References Cited

U.S. PATENT DOCUMENTS

| 5,236,630 | 8/1993 | Mutsumi, et al. ................ 232/512 |
| 5,242,511 | 9/1993 | Yokoyama et al. ............... 148/430 |
| 5,814,248 | 9/1998 | Hiroji, et al. .................... 156/891 |
| 5,891,283 | 4/1999 | Tani et al. ....................... 156/89.15 |

FOREIGN PATENT DOCUMENTS

| 0360587 | 3/1990 | European Pat. Off. . |
| 0624902 | 11/1994 | European Pat. Off. . |

OTHER PUBLICATIONS

Section Ch. Week 8013 Derwent Publications Ltd., London GB, Class A94A, AN 80–22631C, XP002115834 & JP 55 021204 (Sumitomo Bakelite Co.), Feb. 15, 1980, Abstract.

*Primary Examiner*—Yogendra Gupta
*Assistant Examiner*—D G Hamlin
*Attorney, Agent, or Firm*—Ostrolenk, Faber, Gerb & Soffen, LLP

[57] ABSTRACT

A conductive paste for forming via-holes in a ceramic substrate, which paste contains about 80–94 wt. % spherical or granular conductive metal powder having a particle size of about 0.1–50 $\mu$m, 1–10 wt. % resin powder which swells in a solvent contained in the conductive paste and has a particle size of about 0.1–40 $\mu$m, and about 5–19 wt. % an organic vehicle. The paste hardly generates cracks during firing to thereby attain excellent reliability in electric conduction and which can provide a via-hole or through hole having excellent solderability and platability. A method for producing a ceramic substrate making use of the paste is also disclosed.

6 Claims, 1 Drawing Sheet

CONDUCTIVE PASTE AND METHOD FOR PRODUCING CERAMIC SUBSTRATE USING THE SAME

BACKGROUND OF THE INVENTION

1. Field of the Invention

The present invention relates to a conductive paste and a ceramic substrate, and more particularly to a conductive paste used for forming a via-hole in a ceramic substrate and a ceramic substrate which is formed using the paste.

2. Background Art

Conventionally, a multi-layered ceramic substrate in which inner electrodes and circuits are connected with via-holes has generally been produced through the following method.

First, a hole for providing a via-hole is formed in a ceramic green sheet by use of a drill or a punch, and the hole is filled with a conductive paste or conductive metal powder. Then, an electrode or a circuit is formed on a surface of the ceramic green sheet by application of a conductive paste thereto by, for example, a screen printing method. Subsequently, a plurality of the thus-formed ceramic green sheets are laminated and pressed, and the resultant laminate is cut so as to form a ceramic substrate of a predetermined size. As a result of the cut piece being fired, the ceramic and the conductive paste or conductive metal powder packed in the hole for providing a via-hole are co-sintered to thereby establish electric contact between conductor circuits in the ceramic substrate. Thus, a multi-layered ceramic substrate is obtained.

In the above-described conventional method for producing a ceramic substrate, copper powder is used as a conductive material for forming a via-hole, in view of low specific resistivity, resistance to migration generation and low cost. Such copper powder is mixed and dispersed in an organic vehicle in which a resin component such as ethyl cellulose has been dissolved, to thereby serve as a conductive paste.

In the conventional method for producing a ceramic substrate, the ceramic green sheets and via-holes filled with metal powder are simultaneously sintered during the firing step. However, the method has drawbacks. When via-holes are filled with a conductive paste and the resultant ceramic is fired, the obtained metal conductor in the via-holes generates cracks and the ceramic is chipped due to either excessive or insufficient amounts of the paste in the via-holes or the difference in shrinkage between the paste and the ceramic green sheets during firing. Such cracks of the metal conductor in the via-holes and chipping of the ceramic causes poor electric conduction and structural deficiency in the via-holes to thereby decrease reliability of the obtained ceramic substrate.

SUMMARY OF THE INVENTION

In order to overcome the above drawbacks, an object of the present invention is to provide a conductive paste which hardly generates cracks during firing to thereby attain excellent reliability in electric conduction.

Another object of the present invention is to provide a ceramic substrate making use of the paste.

Still another object of the present invention is to provide a conductive paste which can provide a via-hole having excellent solderability and platability. Yet another object of the present invention is to provide a ceramic substrate making use of the paste.

The present invention provides a conductive paste for forming a via-hole in a ceramic substrate, comprising: about 80–94 wt. % of spherical or granular conductive metal powder having a particle size of about 0.1–50 $\mu$m; about 1–10 wt. % of resin powder which swells in a solvent contained in the conductive paste and has a particle size of about 0.1–40 $\mu$m; and about 5–19 wt. % of an organic vehicle comprising the solvent.

Preferably, the conductive metal powder is a copper powder.

Preferably, the solvent in the conductive paste is a terpineol-based solvent, and the resin powder which swells in the solvent is an urethane resin powder or an acrylic resin powder.

The present invention also provides a method for producing a ceramic substrate, comprising the steps of: forming a hole for providing a via-hole in a ceramic green sheet; filling the hole for providing a via-hole with the above described conductive paste; laminating a plurality of the ceramic green sheets each having the hole filled with the conductive paste to form a laminated body; and firing the laminated body.

As used herein, the resin powder which swells in a solvent contained in the conductive paste refers to a resin powder which exhibits swelling in the presence of a solvent that constitutes the organic vehicle contained in the conductive paste.

As used herein, the via-hole refers not only to a via-hole in a narrow sense which is provided for connecting internal electrodes or inner circuits, but also to a through-hole which is formed so as to penetrate the ceramic substrate.

The conductive paste according to the present invention contains spherical or granular conductive metal powder since the via-holes can be filled in a more desirable state with the powder of such a form. The particle size of the conductive metal powder is determined to be about 0.1–50 $\mu$m for the following reasons. When the particle size is less than about 0.1 $\mu$m, the viscosity of the conductive paste increases, and when a base metal powder is used as the conductive metal powder, the particular surfaces of conductive base metal powder are oxidized, to thereby deteriorate the electric conduction resistance characteristic; whereas when the particle size is in excess of about 50 $\mu$m, the paste is no longer suitable for screen printing. The content of the conductive metal powder is determined to be about 80–94 wt. %; when the content is less than about 80 wt. %, the packing density is low, whereas when it is in excess of about 94 wt. %, formation of paste becomes difficult due to an excess solid component.

The particle size of the resin powder which swells in a solvent contained in the paste is determined to be about 0.1–40 $\mu$m. When the particle size is less than about 0.1 $\mu$m, viscosity of the conductive paste increases, whereas when it is in excess of about 40 $\mu$m, the swollen resin powder in the paste clogs the mesh of a screen. Either case is not suited for screen printing. Although the resin powder which swells in a solvent contained in the paste is preferably spherical or granular from the viewpoint of enhancing packing into a hole, a resin powder of a flat shape such as flakes may be used. Furthermore, the content of the resin powder which swells in a solvent contained in the paste is determined to be about 1–10 wt. %. When the content is less than about 1 wt. %, the conductor metal in the via-holes generates cracks; whereas when it is in excess of about 10 wt. %, many cavities are formed in the via-holes to thereby deteriorate electrical resistance and also deteriorate solderability and platability.

Furthermore, in the conductive paste according to the present invention, there may be used a variety of organic vehicles which are generally used for the formation of thick films of conductive paste. Preferably, the organic vehicles incorporated into the paste are chosen in consideration of combination with the binder used in ceramic green sheets. One example of preferable organic vehicles is a ethyl cellulose resin dissolved in a terpineol-based solvent.

As described above, incorporation of a resin powder which swells in a solvent contained in the paste improves packing of the conductive paste into a via-hole and retards sintering of conductive metal in the conductive paste during firing to thereby prevent the conductor metal in the via-holes from cracking after firing. In addition, since the swollen resin powder is removed by decomposition during the firing step, via-holes having excellent solderability and platability can be formed without deteriorating the two characteristics. Moreover, the effect obtained from incorporation of the resin which swells is greater than that of a resin which does not swell. Briefly, swelling, i.e., increase in the volume of the resin powder in the paste, further enhances packing properties and retards sintering of the conductive metal during firing.

Other features and advantages of the present invention will become apparent from the following description of the invention which refers to the accompanying drawings.

DESCRIPTION OF THE PREFERRED EMBODIMENTS

First, a ceramic green sheet was prepared. Briefly, a powder of $BaO-Al_2O_3-SiO_2$ glass composite material was provided as a ceramic material. To this powder, an organic binder such as polyvinyl butyral and an organic solvent such as toluene were added, and the resultant mixture was kneaded so as to prepare a starting slurry. The slurry was formed into a sheet by way of a doctor blade method, to thereby obtain a ceramic green sheet. Subsequently, holes were made in the ceramic green sheet by use of a punch.

Second, a conductive paste was prepared. Briefly, a powder of spherical copper particles was provided as a conductive metal powder, and powders of spherical urethane resin particles and acrylic resin particles were provided as resin powders that swell in the solvent in the conductive paste. An organic vehicle was prepared by dissolving an organic binder ethyl cellulose resin in a terpineol-based solvent. These materials were mixed and kneaded by use of a three-roll mill, to thereby obtain conductive pastes for the formation of via-holes as shown in Table 1. For comparison, a conductive paste formed only of copper powder and an organic vehicle was also prepared.

TABLE 1

| | Composition of conductive paste | | | Evaluations | | | |
| --- | --- | --- | --- | --- | --- | --- | --- |
| Sample No. | Copper powder (wt. %) | Swellable resin powder (wt %) | Organic vehicle (wt. %) | Crack generation | Chipping of ceramic | Platability | Solderability |
| *1 | 85 | 0 | — | 15 | Yes | No | good | good |
| *2 | 85 | 0.5 | Urethane | 14.5 | Yes | No | good | good |
| 3 | 80 | 1 | Urethane | 19 | No | No | good | good |
| 4 | 85 | 5 | Urethane | 10 | No | No | good | good |
| 5 | 85 | 5 | Acrylic | 10 | No | No | good | good |
| 6 | 94 | 1 | Urethane | 5 | No | No | good | good |
| 7 | 90 | 5 | Urethane | 5 | No | No | good | good |
| 8 | 80 | 10 | Urethane | 10 | No | No | good | good |
| *9 | 80 | 15 | Urethane | 5 | Yes (Cavity) | No | bad | bad |
| *10 | 95 | 1 | Urethane | 4 | Formation of paste impossible | | | |
| *11 | 75 | 10 | Urethane | 15 | Yes (poor packing) | No | not so good | not so good |

Samples marked with asterisk (*) fall outside the scope of the invention.

Figure 1:
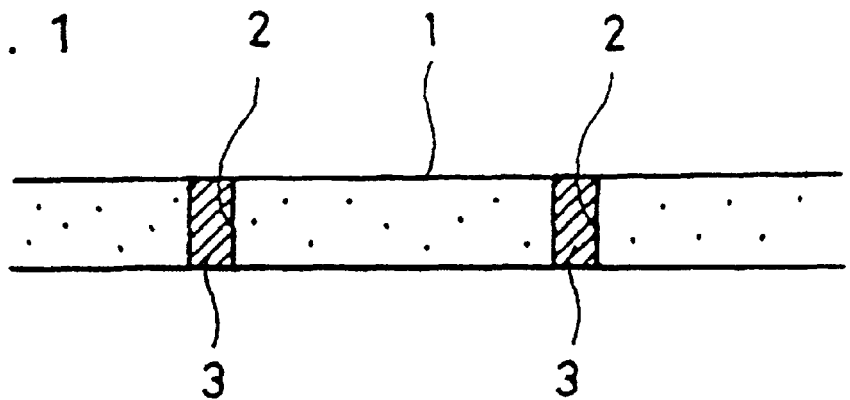
FIG. 1 is a cross-sectional view schematically showing the state in which holes for providing via-holes are filled with a conductive paste.
Figure 2:
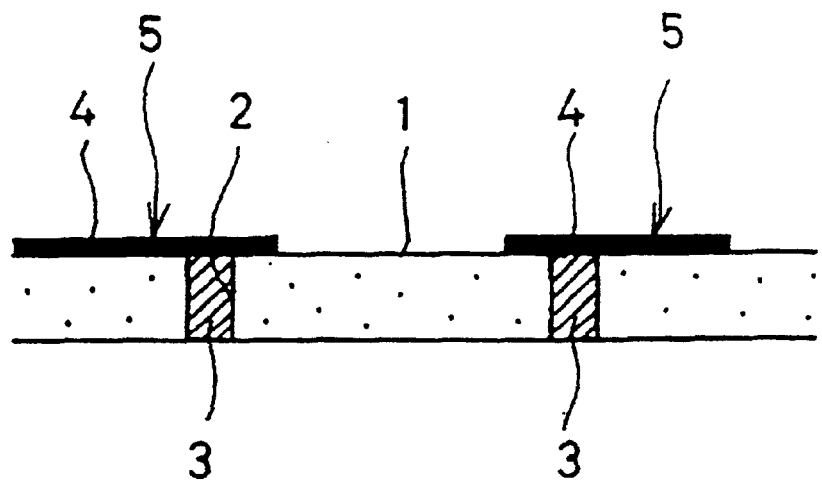
FIG. 2 is a cross-sectional view schematically showing a circuit formed on a ceramic green sheet.

Third, a multi-layered ceramic substrate was formed. Briefly, as shown in FIG. 1, via-holes 2 formed in a ceramic green sheet 1 were filled with a conductive paste 3 through screen printing. After the paste was dry, as shown in FIG. 2, a conductive paste 4 for forming a circuit was applied to the ceramic green sheet 1, also through screen printing, to thereby form a circuit 5.

Figure 3:
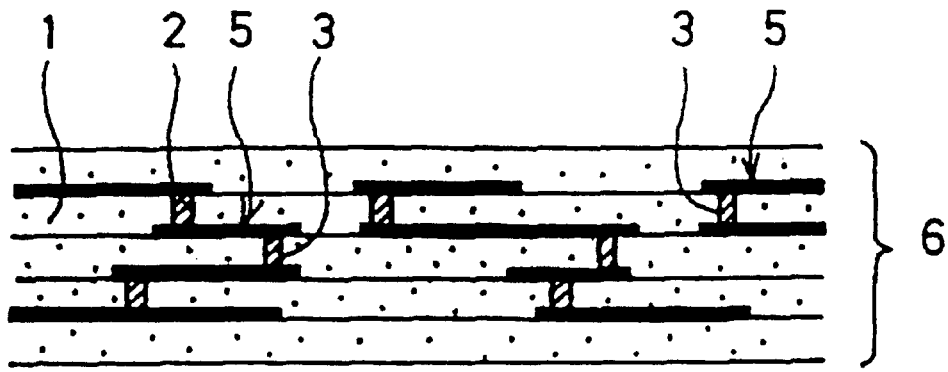
FIG. 3 is a cross-sectional view schematically showing a laminated body formed by laminating a plurality of ceramic green sheets.

Subsequently, as shown in FIG. 3, a plurality of the thus-produced ceramic green sheets 1, each having a predetermined circuit, were laminated and press-bonded to thereby form a laminated body 6, which was cut at predetermined positions. The cut pieces of laminated bodies were fired in a nitrogen atmosphere at 1000° C. for 1–2 hours, to thereby obtain multi-layered ceramic substrates. Although the laminated body was cut at predetermined positions in the present examples, the cutting step may be omitted.

A sample of the obtained ceramic substrates was degreased with a solvent to thereby remove any oily component and oxide film from the conductor surface. The surface of the sample was activated by use of a Pd solution, and electroless-plated with Ni.

Subsequently, the thus-obtained ceramic substrate was cut and its cross-section was observed by use of a stereoscopic microscope to thereby check incidence of cracks of the conductor metal in the via-holes and chipping of the ceramic.

In addition, the surface of the Ni plate film formed on the conductor metal of the via-holes was observed by SEM so as to evaluate platability. The solderability of the surface of the conductor metal of the via-holes was also investigated after soldering. The obtained evaluations on properties are shown in Table 1.

As shown in Table 1, a paste could not be formed in the case of Sample No. 10 which has a copper powder content beyond the scope of the present invention. As in the case of Sample No. 11, which has a content of copper powder below the predetermined range of the present invention, packing of the via-holes was insufficient and crack generation was observed in the conductor metal of the via-holes. Furthermore, the platability and solderability were unsatisfactory.

With regard to the content of the resin powder which swells, as in the case of Sample Nos. 1 and 2 in which the content thereof is below the predetermined range of the present invention, crack generation was observed in the conductor metal of the via-holes, whereas as in the case of Sample No. 9 in which the content thereof is in excess of the predetermined range of the present invention, cavities were observed in the conductor metal of the via-holes and the platability and solderability were unsatisfactory.

In contrast, as in the case of Sample Nos. 3 to 8 in which the contents of copper powder, resin powder which swells and an organic vehicle fall within the scope of the invention, neither crack generation in the conductor metal of the via-holes nor chipping of the ceramic was observed, and ceramic substrates having excellent platability and solderability were obtained. The results are attributed to full realization of the functions of the resin powder which swells. In other words, the resin powder enhances packing, retards shrinkage of the conductor metal during firing to thereby prevent crack generation and decomposes to be removed after firing to thereby cause no adverse effect on the platability and solderability.

Although in the above examples the present invention has been described taking the case of production of ceramic substrates having via-holes, the conductive paste is also applicable to forming through-holes penetrating a ceramic substrate, as well as to forming via-holes in a ceramic substrate. In such a case, the effect of the present invention is also obtained in the formation of a through-hole.

In addition, although the present invention has been described by way of example with reference to the case in which copper powder is used as the conductive metal powder, the conductive powder is not limited to only a copper powder, and there may be used powder of a noble metal such as silver, palladium, platinum or gold and alloys thereof, as well as powder of a base metal such as nickel and alloys thereof.

No particular limitation is imposed on the other components according to the present invention. Therefore, a variety of applications and modifications are possible within the scope of the present invention with respect to, for example, the species of ceramic constituting the ceramic substrate, species of binder used in the ceramic green sheet, species of resin powder which swells in a solvent contained in the conductive paste, or the structure of the ceramic substrate.

As described above, the conductive paste according to the present invention can enhance the packing of the conductive paste into a via-hole to thereby prevent packing failure.

The resin powder which swells in a solvent contained in the conductive paste retards shrinkage of the conductive metal (conductor metal) to thereby prevent crack generation in the via-hole and chipping of the ceramic, which are induced by the difference in firing-induced shrinkage between the conductive paste and ceramic green sheets.

When copper powder is used as the conductive metal powder, there can be realized low specific resistivity, resistance to migration generation, and low cost. Therefore, via-holes having high reliability for electric conduction can be formed at low cost.

Furthermore, the method for producing a conductive paste can effectively provide a via-hole having excellent solderability and platability as well as having high reliability for electric conduction.

While the invention has been particularly shown and described with reference to preferred embodiments thereof, it will be understood by those skilled in the art that the forgoing and other changes in form and details may be made therein without departing from the spirit of the invention.

What is claimed is:

1. A conductive paste for forming a via-hole in a ceramic substrate, comprising:
   about 80–94 wt. % of spherical or granular conductive metal powder having a particle size of about 0.1–50 µm;
   about 1–10 wt. % of resin powder which swells in a solvent contained in the conductive paste and has a particle size of about 0.1–40 µm; and
   about 5–19 wt. % of an organic vehicle comprising a solvent.

2. The conductive paste according to claim 1, wherein the conductive metal powder is a copper powder.

3. The conductive paste according to claim 2, wherein the solvent in the conductive paste is a terpineol-based solvent, and the resin powder which swells in the solvent is an urethane resin powder.

4. The conductive paste according to claim 2, wherein the solvent in the conductive paste is a terpineol-based solvent, and the resin powder which swells in the solvent is an acrylic resin powder.

5. The conductive paste according to claim 1, wherein the solvent in the conductive paste is a terpineol-based solvent, and the resin powder which swells in the solvent is an urethane resin powder.

6. The conductive paste according to claim 1, wherein the solvent in the conductive paste is a terpineol-based solvent, and the resin powder which swells in the solvent is an acrylic resin powder.

* * * * *